US006839293B2

United States Patent
Kawamoto et al.

(10) Patent No.: US 6,839,293 B2
(45) Date of Patent: Jan. 4, 2005

(54) WORD-LINE DEFICIENCY DETECTION METHOD FOR SEMICONDUCTOR MEMORY DEVICE

(75) Inventors: Satoru Kawamoto, Kasugai (JP); Motoki Mizutani, Kasugai (JP); Shinji Nagai, Kasugai (JP); Yoshiharu Kato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 98 days.

(21) Appl. No.: 10/288,461

(22) Filed: Nov. 6, 2002

(65) Prior Publication Data

US 2003/0058717 A1 Mar. 27, 2003

Related U.S. Application Data

(62) Division of application No. 09/768,459, filed on Jan. 25, 2001, now Pat. No. 6,501,691.

(30) Foreign Application Priority Data

Jan. 26, 2000 (JP) ........................................ 2000-017092

(51) Int. Cl.⁷ ............................ G11C 29/00; G11C 7/00
(52) U.S. Cl. ...................... 365/201; 365/210; 365/214
(58) Field of Search .................... 365/201 O, 210, 365/214, 189.09, 200; 324/763, 765

(56) References Cited

U.S. PATENT DOCUMENTS

| 5,371,712 A | | 12/1994 | Oguchi et al. | |
|---|---|---|---|---|
| 5,430,678 A | | 7/1995 | Tomita et al. | |
| 5,790,459 A | * | 8/1998 | Roohparvar | ........... 365/185.21 |
| 5,995,427 A | | 11/1999 | Tsukikawa | |
| 6,333,879 B1 | | 12/2001 | Kato et al. | |

FOREIGN PATENT DOCUMENTS

| JP | 3-181096 | 8/1991 |
|---|---|---|
| JP | 5-67399 | 3/1993 |
| JP | 5-282898 | 10/1993 |
| JP | 6-60697 | 3/1994 |
| JP | 9-17199 | 1/1997 |
| JP | 9-147599 | 6/1997 |

* cited by examiner

Primary Examiner—Van Thu Nguyen
(74) Attorney, Agent, or Firm—Arent Fox PLLC

(57) ABSTRACT

A semiconductor memory device having a burn-in test capability. The semiconductor memory device includes a detection circuit, which is connected to the plurality of word lines. The detection circuit detects whether a stress voltage for a burn-in test has been applied to all of the word lines along their entire lengths in the burn-in test.

5 Claims, 7 Drawing Sheets ns for Semiconductor

WORD-LINE DEFICIENCY DETECTION METHOD FOR SEMICONDUCTOR MEMORY DEVICE

This is a Division of application Ser. No. 09/768,459 filed Jan. 25. 2001 now U.S. Pat. No. 6,501,691. The disclosure of the prior application(s) is hereby incorporated by reference herein in its entirety.

BACKGROUND OF THE INVENTION

The present invention relates to a semiconductor memory device, and more particularly, to a semiconductor memory device having a burn-in test capability.

Because recent semiconductor memory devices, such as a DRAM (Dynamic Random Access Memory), are designed by extremely detailed design rules, DRAMs having an electrical deficiency, such as disconnection, are likely to be produced. To eliminate defects, a burn-in test is conducted on DRAMs before shipment. In the burn-in test, a voltage higher than the normal operational voltage is applied to elements in memory cells and lines over a predetermined time.

Since the conventional burn-in test performs a function operation to sequentially access the individual word lines after packaging, the burn-in test takes time. As the rate of shipping unpackaged chips as products increases, the burn-in test now takes place in the wafer test process.

In the normal operation of a DRAM, a single word line and a column are selected. Cell information is read from or written in those memory cells that are connected to the selected word line and column. In the burn-in test that is made in the wafer test process, a stress voltage is applied to selected plural word lines and bit lines for a predetermined time. This shortens the burn-in test time.

The publications that will be discussed below disclose semiconductor memory devices equipped with a burn-in test capability for selecting a plurality of word lines.

Japanese Unexamined Patent Publication (KOKAI) No. Hei 6-60697 discloses a first prior art semiconductor memory device. The semiconductor memory device includes a row address selector connected to a memory cell array, a changeover circuit connected to the row address selector, a test mode detector connected to the changeover circuit and a refresh address generator connected to the changeover circuit. The refresh address generator supplies a refresh address signal to the changeover circuit. The test mode detector sends a burn-in-test-mode detection signal to the changeover circuit. In accordance with the level of the burn-in-test-mode detection signal, the changeover circuit sends an address select signal to the row address selector. At the time of a burn-in test, the burn-in-test-mode detection signal becomes active so that the changeover circuit supplies the row address selector with an address select signal to select all the word lines at a time.

Japanese Unexamined Patent Publication (KOKAI) No. Hei 9-17199 discloses a second prior art semiconductor memory device. In this semiconductor memory device, the stress voltage is simultaneously supplied to all the word lines via transistors, which are connected to a plurality of word lines, in a burn-in test.

According to the first and second prior art devices, however, it is not detected whether the stress voltage has actually been applied to the word lines in the burn-in test. Since a plurality of memory cells are connected to each word line, each word line has a relatively long length of, for example, about 1000 $\mu$m. If a word line has a conductive failure, such as disconnection, the stress voltage is not applied to the word line over the entire length. Therefore, the burn-in tests according to the first and second prior art devices are relatively unreliable.

Japanese Unexamined Patent Publication (KOKAI) No. Hei 5-67399 discloses a third prior art semiconductor memory device. In the burn-in test mode of the semiconductor memory device, the stress voltage is supplied to a measuring terminal from an external unit. The semiconductor memory device detects whether the stress voltage is supplied to the internal circuits. In the normal operation mode, on the other hand, the supply voltage is supplied to the measuring terminal. The semiconductor memory device detects whether the operational voltage is supplied to the internal circuits.

Japanese Unexamined Patent Publication (KOKAI) No. Hei 9-147599 discloses a fourth prior art semiconductor memory device. The semiconductor memory device includes a burn-in circuit, which executes a burn-in test, an address key circuit, which supplies the burn-in circuit with a mode signal to instruct the execution of the burn-in test, and a burn-in-mode detector, which is connected to both the address key circuit and the burn-in circuit. The burn-in-mode detector detects whether the semiconductor memory device is in burn-in mode based on the mode signal and the input level of an external terminal signal.

In the third and fourth prior art devices, however, it is not detected whether the stress voltage has actually been applied to all the word lines.

Japanese Unexamined Patent Publication (KOKAI) No. Hei 5-282898 discloses a fifth prior art semiconductor memory device. The individual word lines of the semiconductor memory device are connected to the gates of MOS transistors. The current that flows between the drain and source of each transistor and the drain current that is originated from the ON action of the transistor are detected by a test terminal. This makes it possible to detect whether each word line is short-circuited with the power supply.

The transistors in the fifth prior art device are connected in a wired-OR fashion. When all the word lines are selected at a time in a burn-in test mode, therefore, the drain current simultaneously flows in a plurality of transistors. It is not therefore detected whether all the word lines have been selected properly.

As each transistor is turned on when the potential of each word line is equal to or higher than the source potential of that transistor by a predetermined value (threshold value), it is not detected whether the stress voltage has been applied to each word line. If the stress voltage applied to each word line is predictable based on the ON resistance of each transistor, it is not possible to estimate the ON resistance of each transistor when a plurality of transistors are selected at a time. Because the number of those word lines to which the stress voltage has not been applied adequately is not detected, it is not possible to determine whether the chip can be saved by the redundancy operation.

As apparent from the above, the reliabilities of the conventional burn-in tests are insufficient. To supplement the insufficient reliabilities, the wafer test process of semiconductor memory devices are carried out in the following fabrication process.

As shown in FIG. 1, a DC check on each chip on a wafer is performed first in step S1. The DC check sorts out defective chips with a large short-circuit current by detecting the short-circuit current with a supply voltage supplied to each chip. In step S2, a simple function check is performed on each chip on the wafer. The simple function check roughly checks the operation of the internal circuits of each chip.

In step S3, a wafer burn-in test is conducted. Then, a DC check in step S4 and redundancy setting in step S5 are carried out. In step S6, a full function check is executed to check whether all the memory cells operate normally by performing a write operation and read operation on all the memory cells.

In the case of manufacturing packaged devices, dicing (step S7), assembly (step S8) and a simple check (step S9) are executed. To supplement the reliability of the wafer burn-in test in step S3, an additional burn-in test is conducted in step S10 through a normal operation of selecting the word lines one after another and applying the stress voltage to the selected word line. Then, a full function check is performed again (step S11) after which an assembled product will be shipped.

In the case of shipping device chips, an additional burn-in test is conducted on a wafer through the normal operation in step S12 after step S6. Dicing is carried out after a DC check in step S13 and a simple check in step S14, and device chips will then be shipped.

The additional burn-in tests (steps S10 and S12) for improving the reliability of the burn-in test make the test time longer and the cost for the test higher.

SUMMARY OF THE INVENTION

Accordingly, it is an object of the present invention to provide a semiconductor memory device with a high reliability on a wafer burn-in test.

To achieve the above object, the present invention provides a semiconductor memory device having a plurality of word lines. The memory device includes a detection circuit, which is connected to the plurality of word lines. The detection circuit detects whether a stress voltage for a burn-in test has been applied to all of the word lines along their entire lengths.

The present invention also provides a method of detecting a deficiency in a plurality of word lines for a semiconductor memory device having a plurality of memory cells connected to intersections of the plurality of word lines and bit lines. The method includes performing a write operation on associated memory cells by applying a stress voltage to a selected one of the word lines and by applying a write voltage higher than a normal write voltage to the bit lines, and detecting whether there is a deficiency in the plurality of word lines by reading cell information based on the write operation from individual memory cells by applying the stress voltage to the word lines again.

The present invention further provides a method of fabricating a semiconductor memory device. The method includes detecting whether a stress voltage has been normally applied to all word lines over their entire lengths in a wafer burn-in test in a wafer test step, and producing a packaging device and a chip device having shipping specifications based on the result of the detection.

The present invention further provides a semiconductor device including a semiconductor memory device having a plurality of word lines. The semiconductor memory device has a detection circuit, which is connected to the plurality of word lines, for detecting whether a stress voltage for a burn-in test has been applied to all of the word lines over their entire lengths.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 1:
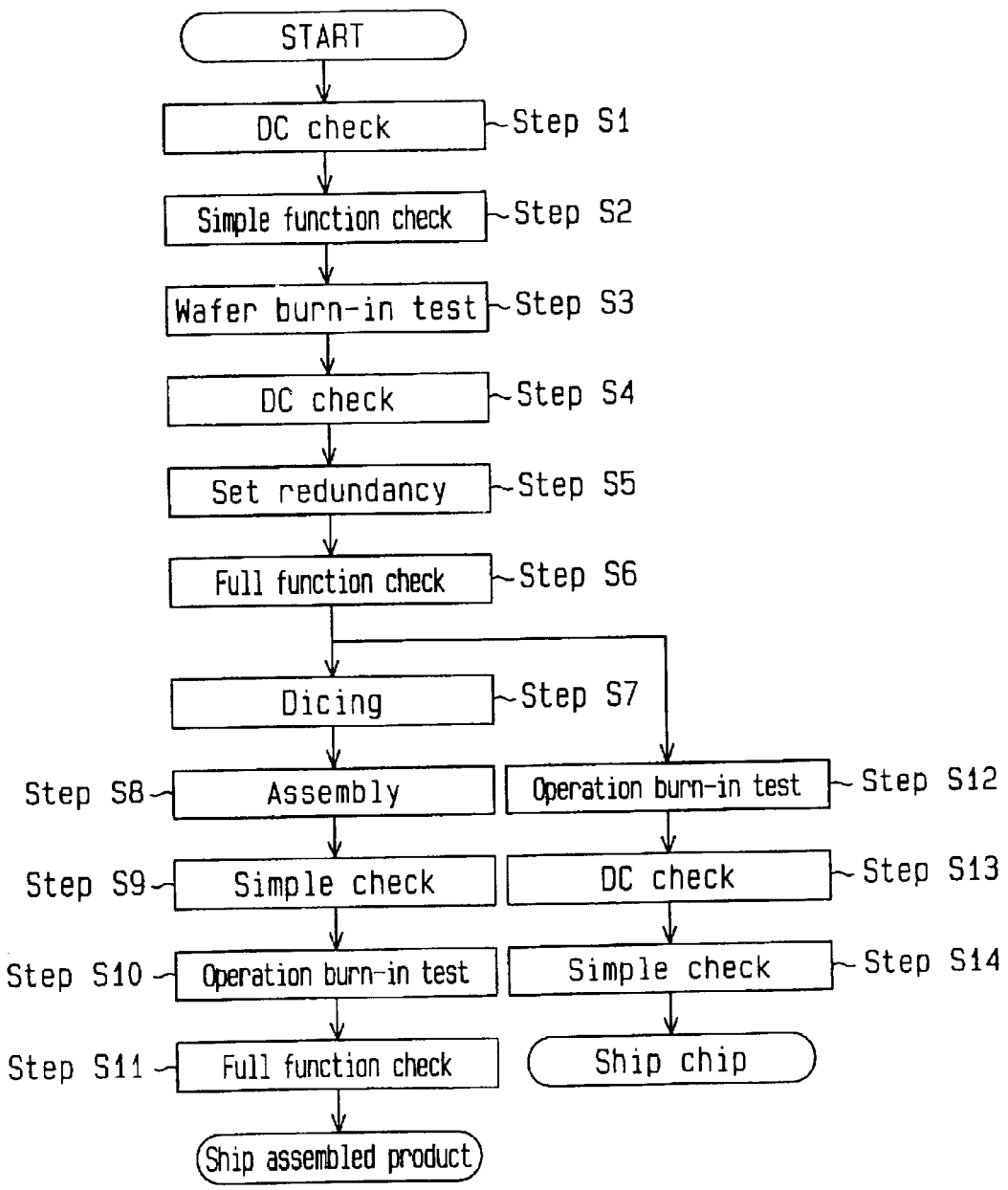
FIG. 1 is a flowchart illustrating the fabrication process of a conventional memory device.
Figure 2:
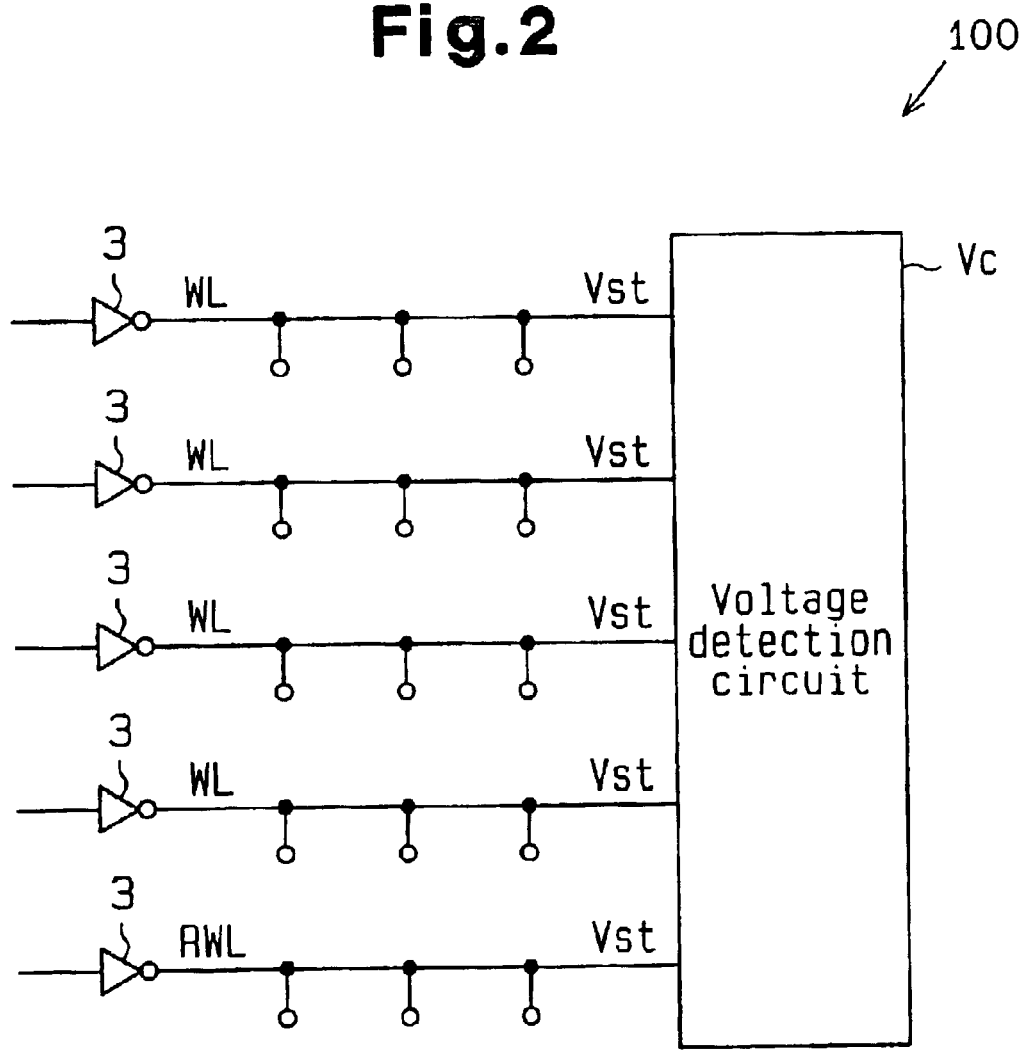
FIG. 2 is a schematic block diagram of a semiconductor memory device according to a first embodiment of the invention.

As shown in FIG. 2, a semiconductor memory device 100 according to the first embodiment of the invention includes a voltage detection circuit VC, word lines WL and a redundancy word line RWL. The word lines WL and the redundancy word line RWL are connected to the voltage detection circuit VC. Corresponding word drivers 3 are connected to the word lines WL and the redundancy word line RWL.

In a burn-in test mode, a stress voltage Vst is applied to the word lines WL and the redundancy word line RWL. The voltage detection circuit VC detects whether the stress voltage Vst has been applied to each word line WL over the entire length.

The following will discuss a semiconductor memory device 200 according to the second embodiment of the invention.

Figure 3:
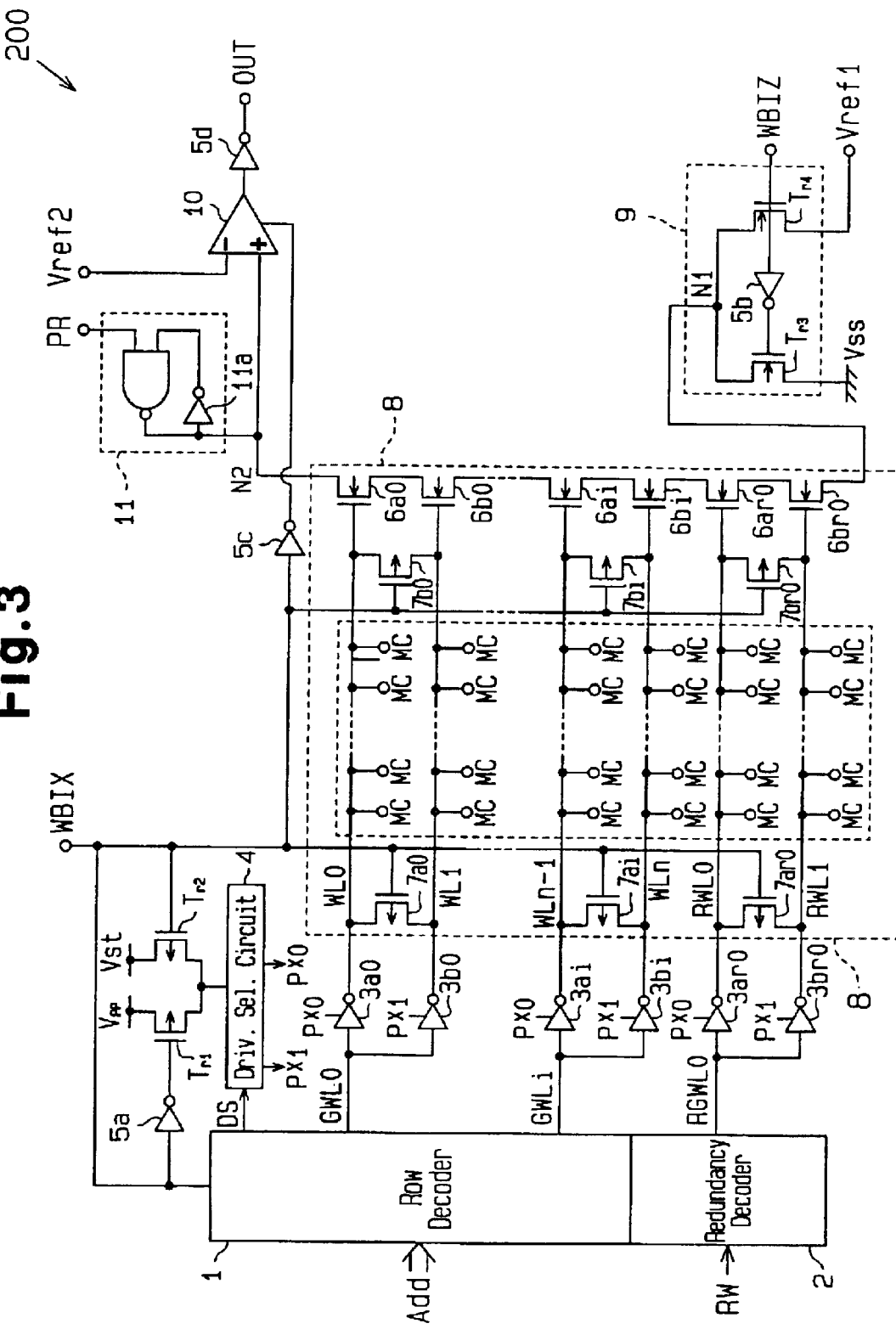
FIG. 3 is a schematic circuit diagram of a semiconductor memory device according to a second embodiment of the invention.

As shown in FIG. 3, the semiconductor memory device (DRAM) 200 includes a row decoder 1, a redundancy decoder 2, which is adjacent to the row decoder 1, global word lines GWL0–GWLi, which are connected to the row decoder 1, a redundancy global word line RGWL0, which is connected to the redundancy decoder 2, a stress-voltage determining circuit 8, which is connected to the global word lines GWL0–GWLi and the redundancy global word line RGWL0, and a stress determination control circuit 9, which is connected to the stress-voltage determining circuit 8. An address signal Add and a first wafer burn-in signal WBIX are supplied to the row decoder 1. The first wafer burn-in signal WBIX is also supplied to the redundancy decoder 2. In a wafer burn-in test mode, the first wafer burn-in signal WBIX is supplied to the row decoder 1 at an L level. In the normal operation mode, the first wafer burn-in signal WBIX is supplied to the row decoder 1 at an H level.

In the normal operation mode, the row decoder 1 selects one of the global word lines GWL0–GWLi in accordance with the address signal Add. In the wafer burn-in test mode, the row decoder 1 selects all the global word lines GWL0–GWLi in accordance with the first wafer burn-in signal WBIX.

A redundancy determining circuit (not shown) supplies a redundancy determination signal RW to the redundancy decoder 2. In the normal operation mode, the redundancy decoder 2 selects the redundancy global word line RGWL0 according to the redundancy determination signal RW. In the wafer burn-in test mode, the redundancy decoder 2 selects the redundancy global word line RGWL0 according to the L-level first wafer burn-in signal WBIX. That is, all the global word lines GWL0–GWLi and the redundancy global word line RGWL0 are selected in the wafer burn-in test mode.

The global word line GWL0 is connected to a pair of word lines WL0 and WL1 via word drivers 3a0 and 3b0. The global word line GWLi is connected to a pair of word lines WLn−1 and WLn via word drivers 3ai and 3bi. The redundancy global word line RGWL0 is connected to a pair of redundancy word lines RWL0 and RWL1 via word drivers 3ar0 and 3br0.

An operational voltage Vpp is supplied to a driver selection circuit 4 via a P channel MOS (PMOS) transistor (first transistor) Tr1. The stress voltage Vst for a burn-in test is supplied to the driver selection circuit 4 via a PMOS transistor (second transistor) Tr2. The operational voltage Vpp is supplied to the word lines in the normal operation mode. When the external supply voltage is 3.3 V, for example, it is preferred that the operational voltage Vpp be 4.0 V and the stress voltage Vst be about 4.5 V. The driver selection circuit 4 supplies a drive voltage px0 to the individual word drivers 3a0, 3ai and 3ar0 and supplies a drive voltage px1 to the individual word drivers 3b0, 3bi and 3br0.

The first wafer burn-in signal WBIX is supplied via an inverter circuit 5a to the gate of the first transistor Tr1, and is directly supplied to the gate of the second transistor Tr2.

Therefore, the operational voltage Vpp is supplied to the driver selection circuit 4 in the normal operation mode and the stress voltage Vst is supplied to the driver selection circuit 4 in the wafer burn-in test mode. The row decoder 1 sends a driver select signal DS to the driver selection circuit 4. In the normal operation mode, the driver selection circuit 4 supplies the drive voltage from the operational voltage Vpp to the word drivers 3a0, 3ai and 3ar0 or the word drivers 3b0, 3bi and 3br0. In the wafer burn-in test mode, on the other hand, the driver selection circuit 4 supplies the drive voltage originated from the stress voltage Vst to all the word drivers 3a0, 3ai, 3ar0, 3b0, 3bi and 3br0.

Each of the word lines WL0-WLn and the redundancy word lines RWL0 and RWL1 is connected to a plurality of memory cells MC. A bit line (not shown) is connected to each memory cell MC.

The gates of word switches 6a0, 6ai, 6ar0, 6b0, 6bi and 6br0, each configured by an N channel MOS (NMOS) transistor, are respectively connected to the distal ends of the word lines WL0-WLn, RWL0 and RWL1. Specifically, the word switches 6a0 and 6b0 are connected to the distal ends of the respective word lines WL0 and WL1. Likewise, the word switches 6ai and 6bi are connected to the distal ends of the respective word lines WLn−1 and WLn. The word switches 6ar0 and 6br0 are connected to the distal ends of the respective redundancy word lines RWL0 and RWL1.

A pair of word-line connection switches 7a0 and 7b0 are connected to the distal ends and proximal ends of the respective word lines WL0 and WL1. A pair of word-line connection switches 7ai and 7bi are connected to the distal ends and proximal ends of the respective word lines WLn−1 and WLn. A pair of word-line connection switches 7ar0 and 7br0 are connected to the distal ends and proximal ends of the respective redundancy word lines RWL0 and RWL1. Each of the word-line connection switches 7a0, 7b0, 7ai, 7bi, 7ar0 and 7br0 is a PMOS transistor. The first wafer burn-in signal WBIX is supplied to the gate of each word-line connection switches 7a0, 7b0, 7ai, 7bi, 7ar0 or 7br0. In the wafer burn-in test mode, therefore, the word-line connection switches 7a0, 7b0, 7ai, 7bi, 7ar0 and 7br0 are turned on, thereby allowing all the word line pairs to have the same potential.

The word switches 6a0, 6ai, 6ar0, 6b0, 6bi and 6br0 are connected in series. The word switches 6a0, 6ai, 6ar0, 6b0, 6bi and 6br0 and the word-line connection switches 7a0, 7b0, 7ai, 7bi, 7ar0 and 7br0 constitute the stress-voltage determining circuit 8.

The stress determination control circuit 9 is connected to the input terminal of the stress-voltage determining circuit 8 or an input node N1. The stress determination control circuit 9 includes NMOS transistors Tr3 and Tr4 and an inverter circuit 5b. The drains of the NMOS transistors Tr3 and Tr4 are connected to the input node N1. The source of the NMOS transistor Tr3 is connected to a voltage supply Vss. The source of the NMOS transistor Tr4 is supplied with a first reference voltage Vref1. The gate of the NMOS transistor Tr4 is supplied with a second wafer burn-in signal WBIZ.

The first reference voltage Vref1 is lower than the stress voltage Vst by a threshold value Vth of the NMOS transistors of the word switches 6a0, 6ai, 6ar0, 6b0, 6bi and 6br0, or the memory cells MC (Vref1=Vst−Vth). When the stress voltage Vst is 4.5 V and the threshold value Vth is 1 V, for example, the first reference voltage Vref1 is 3.5 V.

The output terminal of the stress-voltage determining circuit 8 or an output node N2 is connected to the positive input terminal of a comparator 10. A second reference voltage Vref2 is supplied to the negative input terminal of the comparator 10.

The second reference voltage Vref2 is lower than the stress voltage Vst by ½ of the threshold value Vth and is given by the following equation.

$$Vref2 = Vst - Vth/2$$

When the stress voltage Vst is 4.5 V and the threshold value Vth is 1 V, for example, the second reference voltage Vref2 is 4.0 V. When the voltage at the output node N2 exceeds 4.0 V, the output signal of the comparator 10 has an H level. When the voltage at the output node N2 is equal to or lower than 4.0 V, on the other hand, the output signal of the comparator 10 has an L level. The output signal of the comparator 10 is inverted by an inverter circuit 5d and the inverted signal is supplied to a burn-in tester device from an external terminal as an output signal OUT.

The first wafer burn-in signal WBIX is supplied to the comparator 10 via an inverter circuit 5c. In the wafer burn-in test mode, therefore, the comparator 10 is enabled by the H-level output signal supplied from the inverter circuit 5c.

A preset circuit 11, which operates on the same potential as the stress potential, is connected to the output node N2. The preset circuit 11 is supplied with an L-level one-shot pulse signal, or preset signal PR, at the time the burn-in test is initiated. The preset circuit 11 resets the voltage at the output node N2 to the level of the stress voltage Vst (4.5 V) in accordance with the preset signal PR.

The preset circuit 11 includes an inverter circuit 11a, the threshold value of which is set to approximately 4.0 V. With the preset signal PR having an H level, the preset circuit 11 functions as a latch circuit to latch the potential at the output node N2 to the level of the stress voltage Vst or the level of the supply voltage Vss.

The operation of the semiconductor memory device 200 according to the second embodiment will be discussed below.

In the wafer burn-in test mode, the L-level first wafer burn-in signal WBIX, the H-level second wafer burn-in signal WBIZ and the stress voltage Vst are supplied to the semiconductor memory device 200. As a result, the first transistor Tr1 is turned off and the second transistor Tr2 is turned on, causing the stress voltage Vst to be applied to the driver selection circuit 4. The driver selection circuit 4 supplies the drive voltages px0 and Px1 corresponding to the stress voltage Vst to all the word drivers 3a0, 3ai, 3ar0, 3b0, 3bi and 3br0. The row decoder 1 selects all the global word lines GWL0–GWLi. Therefore, the stress voltage Vst is applied to all the word lines WL0-WLn and redundancy word lines RWL0 and RWL1. The word-line connection switches 7a0, 7b0, 7ai, 7bi, 7ar0 and 7br0 are turned on by the L-level first wafer burn-in signal WBIX.

In the stress determination control circuit 9, the NMOS transistor Tr4 is turned on and the NMOS transistor Tr3 is turned off, thereby supplying the first reference voltage Vref1 to the input node N1. In response to the preset signal PR, the preset circuit 11 charges the output node N2 to the level of the stress voltage Vst. The H-level output signal of the inverter circuit 5c enables the comparator 10.

The stress voltage Vst is applied to the word lines WL0-WLn and redundancy word lines RWL0 and RWL1, thus turning on all the word switches 6a0, 6ai, 6ar0, 6b0, 6bi and 6br0. Consequently, the voltage at the output node N2 falls from the preset level (stress voltage Vst) to the first reference voltage Vref1 lower than the second reference voltage Vref2. As a result, the output signal of the comparator 10 is inverted to the L level from the H level.

When the output signal OUT of the inverter circuit 5d is at the H level, the burn-in tester device confirms that the stress voltage Vst is properly applied to all the word lines WL0-WLn and redundancy word lines RWL0 and RWL1.

At least one of the word switches 6a0, 6ai, 6ar0, 6b0, 6bi and 6br0 is turned off and the output node N2 is kept at the level of the stress voltage Vst in the following cases:

(1) Both of two word lines that are controlled by a common global word line are deficient and the stress voltage Vst is not applied at all to the distal ends of the two word lines.

(2) The voltage level of this part of the word lines does not reach the stress voltage Vst. In this case, the output signal of the comparator 10 is kept at the H level and the output signal OUT of the inverter circuit 5d at the L level.

When detecting the L-level output signal OUT, the burn-in tester device recognizes that there is a word line to which the stress voltage Vst is not applied properly. In this case, the chip is deficient.

When one of two word lines that are controlled by a common global word line is deficient, the stress voltage Vst is also applied to the deficient word line via the word-line connection switches 7a0, 7b0, 7ai, 7bi, 7ar0 and 7br0 and the word switch that is connected to the deficient word line is turned on.

In this case, the chip is saved by replacing the global word line that corresponds to the deficient word line with the redundancy global word line, so that the chip is not considered to be defective. This is based on the premise that the probability of a deficiency occurring in one of two word lines that are connected to the global word line over a plurality of global word lines is extremely low.

In the normal operation mode, the H-level first wafer burn-in signal WBIX and the L-level second wafer burn-in signal WBIZ are supplied. In accordance with the address signal Add, the row decoder 1 selects one global word line or redundancy global word line. The first transistor Tr1 is turned on to supply the operational voltage Vpp to the driver selection circuit 4. The driver selection circuit 4 supplies the drive voltages px0 and px1 (operational voltage Vpp and supply voltage Vss) to the individual word drivers 3a0, 3ai, 3ar0, 3b0, 3bi and 3br0.

The comparator 10 is disabled by the L-level output signal supplied from the inverter circuit 5c. In the stress determination control circuit 9, the NMOS transistor Tr4 is turned off and the NMOS transistor Tr3 is turned on so that the voltage at the input node N1 is set to the level of the supply voltage Vss. All of the word-line connection switches 7a0, 7b0, 7ai, 7bi, 7ar0 and 7br0 are turned off.

In the normal operation mode, as apparent from the above, one of the word lines WL0-WLn or one of redundancy word lines RWL0 and RWL1 is selected based on the address signal Add. Cell information is written in or read from those in the memory cells MC connected to the selected word line which are selected by the column decoder.

The semiconductor memory device 200 of the second embodiment has the following advantages.

(1) As the burn-in tester device detects the H-level output signal OUT, it detects that the stress voltage Vst is adequately applied to the word lines WL0-WLn and redundancy word lines RWL0 and RWL1.

(2) Even if one of a pair of word lines is deficient, the stress voltage Vst is applied to both word lines by the word-line connection switches 7a0, 7b0, 7ai, 7bi, 7ar0 and 7br0. In this case, as the inverter circuit 5d outputs the H-level output signal OUT, the burn-in tester device can detect that the stress voltage Vst has been applied to all the word lines.

(3) When the stress voltage Vst is not properly applied to a pair of word lines, the inverter circuit 5d outputs the L-level output signal OUT. Based on the output signal OUT, therefore, improper application of the stress voltage Vst is detected.

The semiconductor memory device 200 of the second embodiment may be modified as follows.

Figure 4:
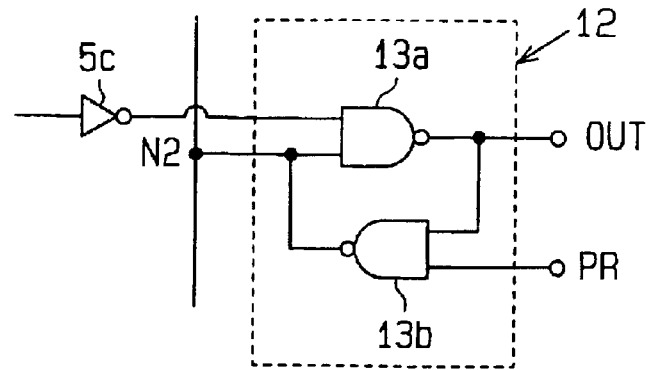
FIG. 4 is a schematic diagram of a latch circuit as another example of a comparator.

A latch circuit 12 shown in FIG. 4 may be used in place of the comparator 10. The latch circuit 12 includes a first NAND gate 13a and a second NAND gate 13b. The two input terminals of the first NAND gate 13a are respectively connected to the inverter circuit 5c and the output node N2. The first input terminal of the second NAND gate 13b is connected to the output terminal of the first NAND gate 13a. The second input terminal of the second NAND gate 13b is supplied with the preset signal PR. The output terminal of the second NAND gate 13b is connected to the output node N2. The threshold value of the first NAND gate 13a is approximately 4.0 V, and the voltage of the H-level output signal of the second NAND gate 13b has the level of the stress voltage Vst.

In the wafer burn-in test mode, the output node N2 is preset to the stress voltage Vst by the preset signal PR and the inverter circuit 5c outputs an H-level signal. Accordingly, the first NAND gate 13a outputs the L-level output signal OUT. The first and second NAND gates 13a and 13b latch the L-level output signal OUT.

Under this situation, when all the word switches 6a0, 6ai, 6ar0, 6b0, 6bi and 6br0 are turned on and the voltage at the output node N2 becomes 3.5 V, the output signal OUT of the first NAND gate 13a is inverted to the H level. Then, the first and second NAND gates 13a and 13b latch the H-level output signal OUT.

When all the word switches 6a0, 6ai, 6ar0, 6b0, 6bi and 6br0 are turned on, therefore, the latch circuit 12 like the comparator 10 inverts the output signal OUT.

Figure 5:
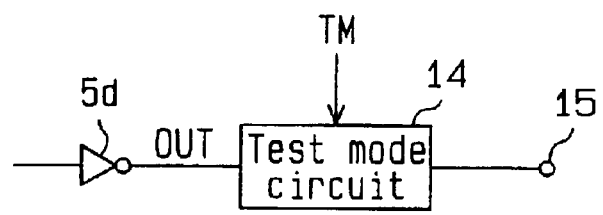
FIG. 5 is a circuit diagram showing a test mode circuit connected to an inverter circuit.

As shown in FIG. 5, a test mode circuit 14, which is enabled by a test mode signal TM supplied to in the burn-in test mode may be connected to the inverter circuit 5d. The test mode circuit 14 sends the output signal OUT of the inverter circuit 5d to an external terminal 15 in response to the test mode signal TM. In the normal operation mode, the test mode circuit 14 is disabled so that the external terminal 15 is used as an input/output terminal for an arbitrary signal. In the burn-in test mode, the output signal OUT of the inverter circuit Sd is sent out from the external terminal 15.

Figure 6:
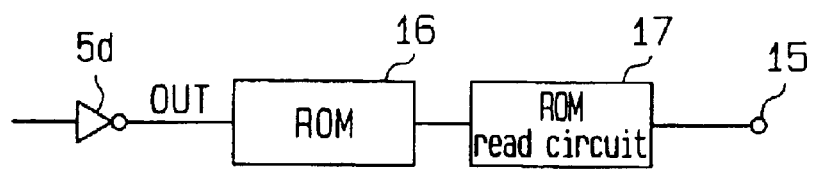
FIG. 6 is a circuit diagram showing a ROM and a ROM read circuit connected to an inverter circuit.

As shown in FIG. 6, a programmable ROM 16 and a ROM read circuit 17 may be connected to the inverter circuit 5d. The output signal OUT of the inverter circuit 5d is written in the ROM 16. The ROM read circuit 17 reads data of the output signal written in the ROM 16 and sends out the data from the external terminal 15.

In this case, it is possible to read the output signal OUT of the inverter circuit 5d written in the ROM 16 and detect whether the stress voltage Vst has been applied properly in any step after the wafer burn-in test is completed.

Figure 7:
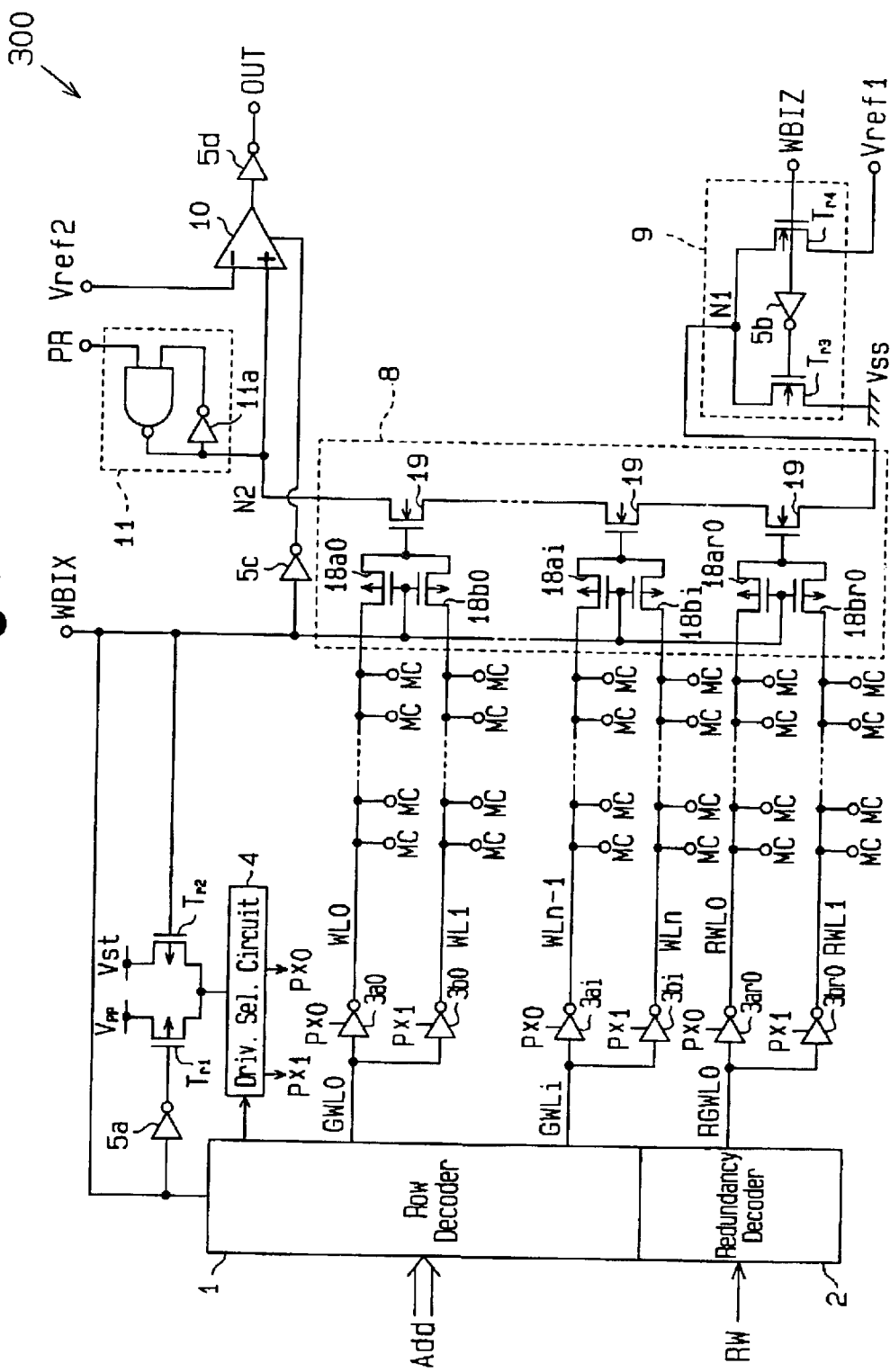
FIG. 7 is a schematic circuit diagram of a semiconductor memory device according to a third embodiment of the invention.

A semiconductor memory device 300 according to the third embodiment of the invention will be described below referring to FIG. 7. The third embodiment differs from the second embodiment in the stress-voltage determining circuit 8.

The stress-voltage determining circuit 8 includes plural pairs of word-line connection switches 18a and 18b configured by PMOS transistors and a plurality of word switches 19 configured by NMOS transistors. Each pair of word-line connection switches 18a and 18b are connected to the distal ends of each associated pair of word lines that are-controlled by a common global word line. Each word switch 19 has its gate connected to a node between the associated pair of word-line connection switches 18a and 18b.

The first wafer burn-in signal WBIX is supplied to the gates of the word-line connection switches 18a and 18b. In the wafer burn-in test mode, the word-line connection switches 18a and 18b are turned on based on the L-level first wafer burn-in signal WBIX. In this case, when the stress voltage Vst is applied to one of the word line pair, the word switch 19 is turned on.

The semiconductor memory device 300 of the-third embodiment has fewer word switches 19, thus making the stress-voltage determining circuit 8 smaller.

A semiconductor memory device 400 according to a fourth embodiment of the invention will now be discussed below referring to FIG. 8.

The semiconductor memory device 400 of the fourth embodiment detects whether the stress voltage has been properly applied to the word lines in the wafer burn-in test mode by using a dummy cell group provided in the memory cell array. The dummy cell group is connected to a pair of bit lines provided at the peripheral portion of the memory cell array in order to protect normal cells against, for example, external noise. In the normal operation mode, the dummy cell group is not accessed.

Figure 8:
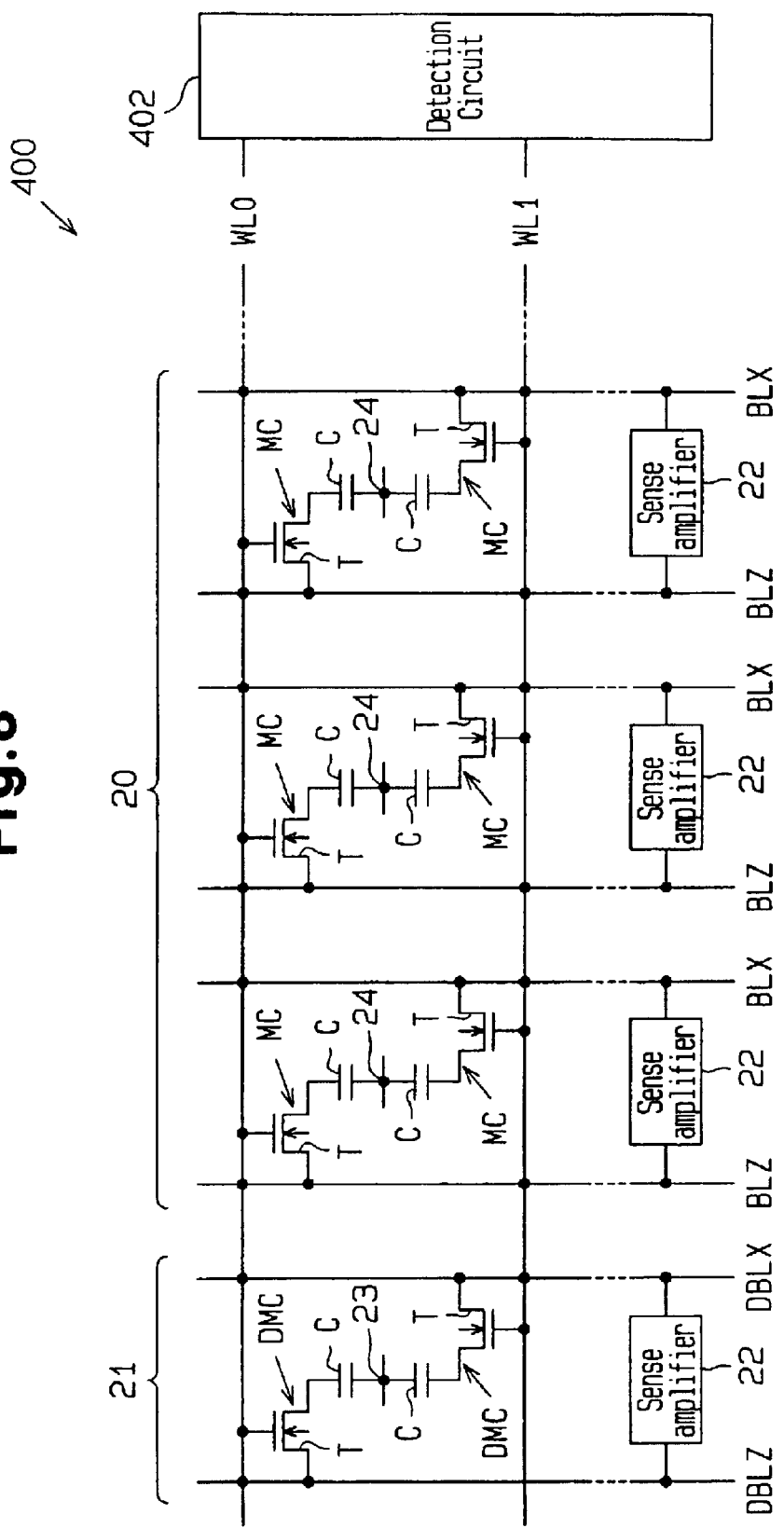
FIG. 8 is a schematic circuit diagram of a semiconductor memory device according to a fourth embodiment of the invention.

As shown in FIG. 8, in the memory cell array of the semiconductor memory device 400 of the fourth embodiment there are a normal memory cell group 20, which performs a normal write operation and a normal read operation, and a dummy cell group 21, which is located adjacent to the normal memory cell group 20 and is connected to the word lines WL0-WLn and redundancy word lines. Specifically, dummy cells DMC in the dummy cell group 21 are connected to the word lines WL0-WLn and each dummy cell DMC is connected to associated dummy bit lines DBLZ and DBLX.

Sense amplifiers 22 are connected between the dummy bit lines DBLZ and DBLX and between normal bit lines BLZ and BLX. Each sense amplifier 22 reads cell information from the dummy cells DMC or the normal memory cells MC.

The wafer burn-in test will be discussed below.

Before the stress voltage Vst is supplied to the word lines WL0-WLn and redundancy word lines RWL, a voltage that is given by Vst—2Vth where Vth is the threshold voltage value of a cell transistor T is supplied to an opposing electrode 23 of a cell capacitor C in each dummy cell DMC in order to protect the dummy cell DMC. When the threshold voltage value Vth is 1 V and the stress voltage Vst is 4.5 V, for example, the voltage of the opposing electrode 23 is 2.5 V. To protect the normal memory cells MC, it is desirable to electrically isolate opposing electrodes 24 of the normal memory cells MC from the opposing electrodes 23 of the dummy cells DMC.

Next, a voltage of 3.5 V (Vst—Vth) is applied to, for example, the bit line BLZ and the stress voltage Vst is applied to one of the word lines WL0-WLn and redundancy word lines RWL. If the stress voltage Vst is supplied to the selected word line over the entire length, the cell transistor T of the dummy cell DMC is turned on. Accordingly, the cell capacitor C of the dummy cell DMC is charged to 3.5 V and "1" is written as cell information.

When the stress voltage Vst is not applied to the cell transistor T of the dummy cell DMC due to a deficiency in the selected word line, the cell transistor T is not turned on. In this case, the cell capacitor C is not charged and "0" is written as cell information.

Next, to read cell information from any dummy cell DMC where writing has been done, the voltages on the dummy bit lines DBLZ and DBLX of the dummy cell group 21 are reset to 2.5 V (Vst—2Vth), then the stress voltage Vst is applied again to the word line to which the stress voltage Vst has been applied previously. As a result, cell information is read from the target dummy cell DMC onto the dummy bit lines DBLZ and DBLX, thereby producing a slight potential difference between the dummy bit lines DBLZ and DBLX. The sense amplifier 22 amplifies the potential difference and outputs cell information.

When the cell information is "1", a detection circuit 402 detects that the stress voltage Vst has properly been applied to the selected word line. When the cell information is "0", the detection circuit 402 detects that the stress voltage Vst has not properly been applied to the selected word line.

By repeating the above-described operation for all the word lines WL0-WLn and RWL, it is detected whether there is a deficiency in the word lines WL0-WLn and RWL. The wafer burn-in test which selects all the word lines at a time is performed on chips that have no deficiencies and deficient chips that can be saved by the redundancy operation.

Instead of writing and reading cell information in and from dummy cells with respect to each word line, all the word lines may be selected simultaneously so that cell information is simultaneously written in all the dummy cells DMC.

In this case, with the write potential (3.5 V) applied to both dummy bit lines DBLZ and DBLX of the dummy cell group 21, the word lines are simultaneously selected and writing to the dummy cells DMC is carried out in this state. Thereafter, the word lines are selected one by one and cell information is read from the dummy cells DMC as in the above-described case.

This operation makes it possible to detect whether there is any deficiency in the word lines and shortens the time required to write cell information in the dummy cells DMC. The sense amplifiers 22 and the dummy bit line pair (DBLZ and DBLX) are controlled to be disabled when the semiconductor memory device is in the normal operation.

Figure 9:
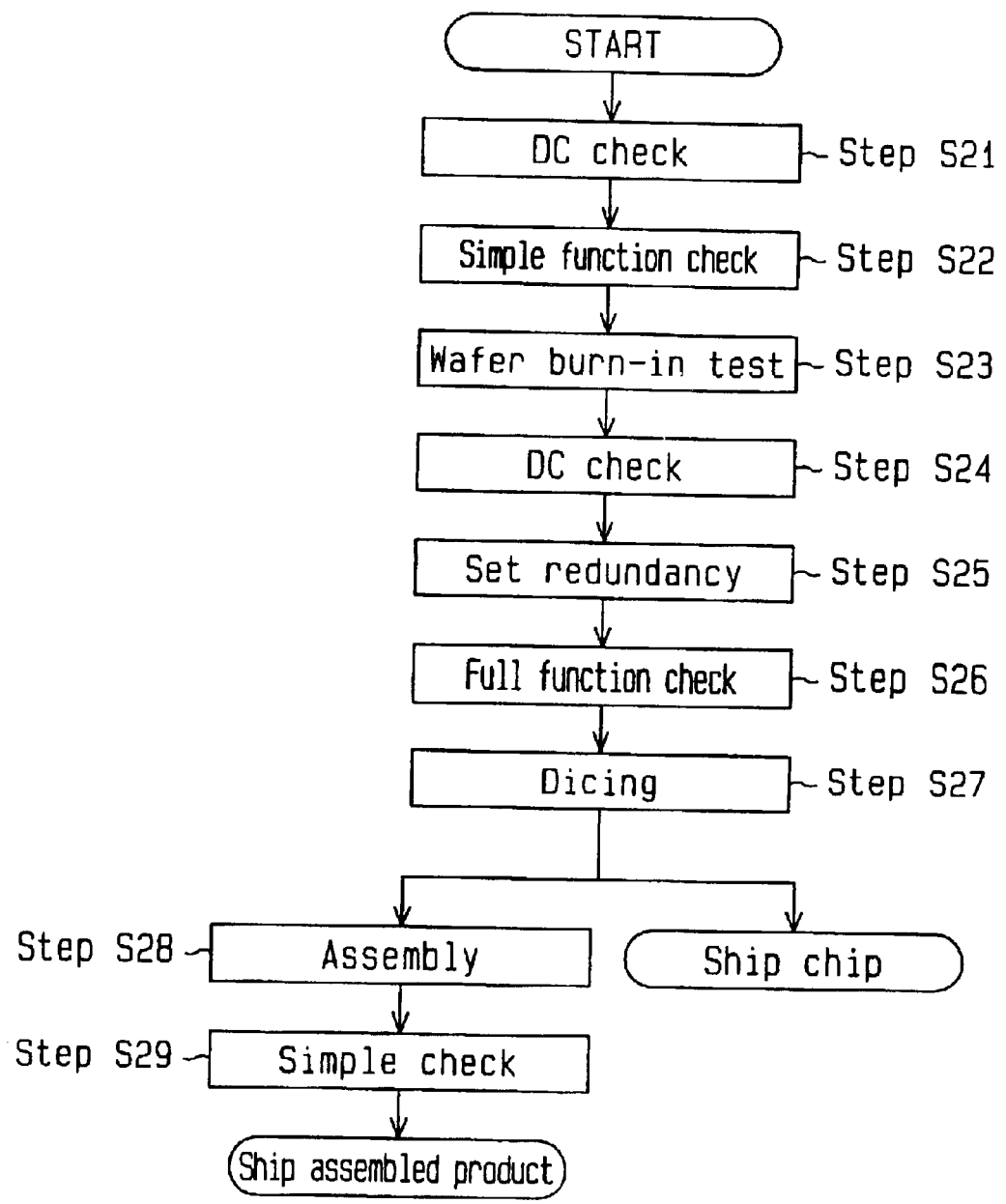
FIG. 9 is a flowchart illustrating the fabrication process of semiconductor memory devices according to the first to fourth embodiments of the invention.

A description will now be given of a process testing memory devices of the first to third embodiments and a process of assembling the memory devices with reference to FIG. 9.

In the wafer testing process, a DC check in step S21 and a simple function check in step S22 are performed as in the prior art.

In step S23, a wafer burn-in testing process is executed. In the wafer burn-in testing process according to each of the first to third embodiments, it is detected with a high reliability whether the stress voltage has been applied to the word lines. In the fourth embodiment, it is detected first whether the stress voltage has properly been applied to all the word lines and then the wafer burn-in test is conducted. This makes the burn-in test highly reliable.

In steps S24 and S25, a DC check and redundancy setting are carried out as in the prior art. In step S26, a full function check is executed to perform a write operation and read operation on all the memory cells and to check whether all the memory cells are operating normally. After dicing in step S27, chips will be shipped.

Packages devices will be shipped after assembling in step S28 and a simple check in step S29.

As apparent from the above, because the memory devices of the first to fourth embodiments have an improved reliability on the wafer burn-in test, steps S10 to S14 in the prior art are omitted. This shortens the testing time and reduces the cost for the test.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A method of fabricating a semiconductor memory device comprising the steps of:

detecting whether a stress voltage has been normally applied to all word lines over their entire lengths in a wafer burn-in test in a wafer test step, wherein the detection step detects whether the stress voltage has been normally applied to all of the word lines over their entire lengths by checking whether cell information has been written in dummy cells adjacent to normal memory cells; and producing a packaging device and a chip device having shipping specifications based on the result of the detection.

2. The method according to claim 1, wherein the detection step detects whether the stress voltage has been normally applied to all of the word lines over their entire lengths based on a voltage that varies in accordance with operations of a plurality of word switches connected to the plurality of word lines.

3. A method of fabricating a semiconductor memory device having a plurality of memory cells connected to intersections of a plurality of word lines and bit lines, the method comprising the steps of:

detecting whether a stress voltage has been normally applied to all word lines over their entire lengths in a wafer burn-in test in a wafer test step, wherein the step of detecting includes:

performing a write operation on associated memory cells by applying a stress voltage to a selected one of the word lines and by applying a write voltage higher than a normal write voltage to the bit lines; and detecting whether there is a deficiency in the plurality of word lines by reading cell information based on the write operation from individual memory cells by applying the stress voltage to the word lines again; and producing a packaging device and a chip device having shipping specifications based on the result of the detection.

4. The method according to claim 3, wherein the detection step detects whether the stress voltage has been normally applied to all of the word lines over their entire lengths based on a voltage that varies in accordance with operations of a plurality of word switches connected to the plurality of word lines.

5. The method according to claim 3, wherein the detection step detects whether the stress voltage has been normally applied to all of the word lines over their entire lengths by checking whether cell information has been written in dummy cells adjacent to normal memory cells.

* * * * *